United States Patent
Epitaux et al.

(10) Patent No.: US 7,309,173 B2
(45) Date of Patent: Dec. 18, 2007

(54) OPTICAL TRANSPONDER MODULE WITH DUAL BOARD FLEXIBLE CIRCUIT

(75) Inventors: Marc Epitaux, Sunnyvale, CA (US); Pete Kirkpatrick, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/168,179

(22) Filed: Jun. 27, 2005

(65) Prior Publication Data

US 2006/0291785 A1 Dec. 28, 2006

(51) Int. Cl.
*G02B 6/36* (2006.01)
*G02B 6/42* (2006.01)

(52) U.S. Cl. .......................................... 385/92; 385/88
(58) Field of Classification Search ............... None
See application file for complete search history.

(56) References Cited

U.S. PATENT DOCUMENTS

| | | | |
|---|---|---|---|
| 6,061,246 A | | 5/2000 | Oh et al. |
| 6,350,387 B2 * | | 2/2002 | Caron et al. ............... 430/314 |
| 6,845,184 B1 | | 1/2005 | Yoshimura et al. |
| 6,918,179 B2 * | | 7/2005 | Randall et al. ............ 29/854 |
| 7,153,043 B1 * | | 12/2006 | Zhang et al. .............. 385/92 |
| 7,156,562 B2 * | | 1/2007 | Mazotti et al. ............ 385/92 |
| 2004/0086240 A1 * | | 5/2004 | Togami et al. ............. 385/92 |
| 2005/0084268 A1 | | 4/2005 | Weigert |
| 2005/0112910 A1 * | | 5/2005 | Randall et al. ............. 439/62 |
| 2005/0168957 A1 * | | 8/2005 | Kawauchi et al. ......... 361/749 |
| 2005/0213924 A1 * | | 9/2005 | Sakurai et al. ............ 385/147 |
| 2006/0133819 A1 * | | 6/2006 | Yu et al. .................. 398/164 |

FOREIGN PATENT DOCUMENTS

EP     1 301 061 A     4/2003
EP     1 503 232 A2    2/2005

OTHER PUBLICATIONS

PCT/US2005/024891, PCT Invitation to Pay Additional Fees, Oct. 26, 2006.
PCT/US2005/024891, PCT International Search Report and Written Opinion, Feb. 2, 2007.

\* cited by examiner

*Primary Examiner*—Tina M. Wong
(74) *Attorney, Agent, or Firm*—Blakely, Sokoloff, Taylor & Zafman LLP

(57) ABSTRACT

According to embodiments of the present invention, an XFP optical transponder module includes a dual board flexible circuit. In embodiments, the dual board flexible circuit includes two printed circuit boards coupled together via a connector. In one embodiment, the connector is a flexible printed circuit. In an alternative embodiment, the connector is a plug-socket assembly.

15 Claims, 6 Drawing Sheets

OPTICAL TRANSPONDER MODULE WITH DUAL BOARD FLEXIBLE CIRCUIT

BACKGROUND

1. Field

Embodiments of the present invention relate to telecommunication equipment and, in particular, to optical transponders.

2. Discussion of Related Art

Transponders may be used in telecommunication systems and/or networks to receive and transmit data and/or other information on optical and/or electrical signals. Traditional optical transponders have limitations however.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF EMBODIMENTS

Figure 1:
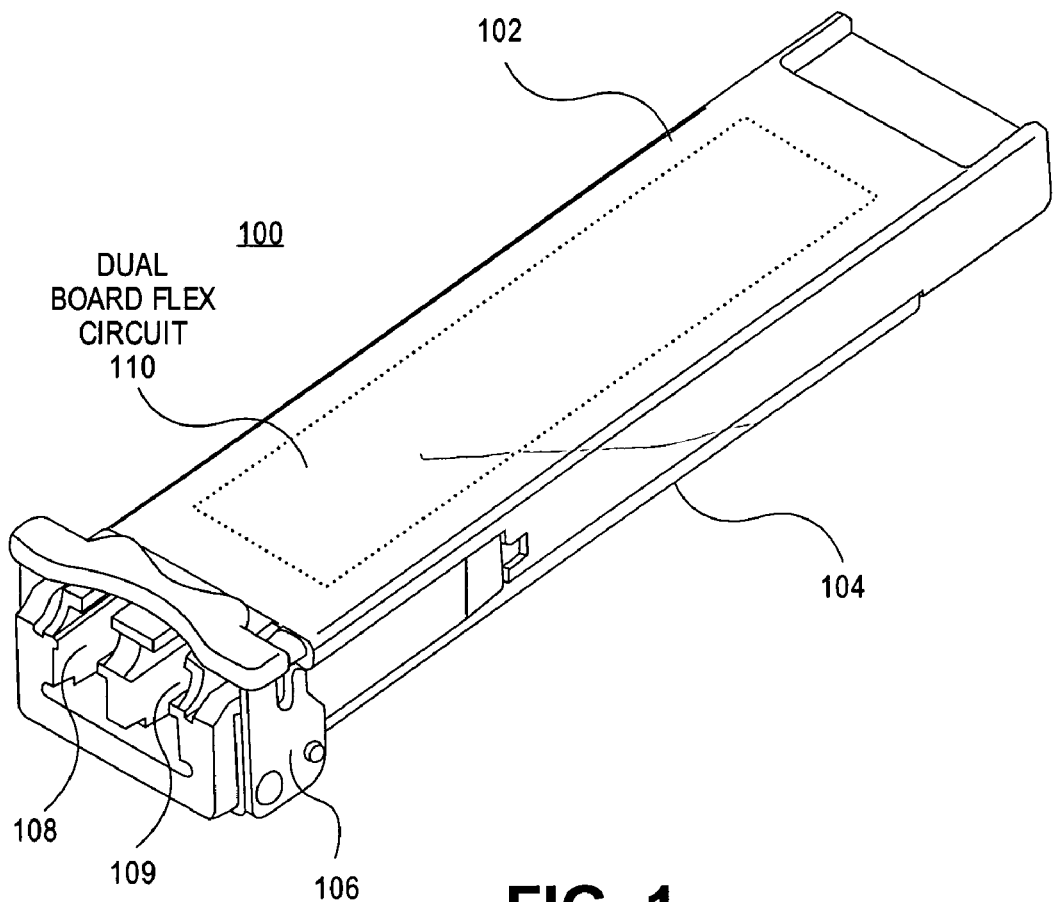
FIG. 1 is a perspective view of an optical transponder module according to an embodiment of the present invention.

FIG. 1 is a perspective view of an optical transponder module 100 according to an embodiment of the present invention. In the illustrated embodiment, the module 100 includes a housing having module lid 102 and a module body 104. A port 109 may be used to couple an optical signal to a receiver portion of the optical transponder module 100. A port 108 may be used to couple an optical signal out of a transmitter portion of the optical transponder module 100. In the illustrated embodiment, the module 100 also includes a dual board flex circuit 110.

In embodiments of the present invention, the module 100 may be compatible with the Institute of Electrical and Electronics Engineers (IEEE) 802.3ae Standard for Carrier Sense Multiple Access with Collision Detection (CSMA/CD) Access Method and Physical Layer Specification-Media Access Control (MAC) Parameters, Physical Layer and Management Parameters for 10 Gb/s Operation, published Aug. 30, 2002. For example, the module 100 may be compatible with the XFP MSA family of devices, the XENPAK MSA family of devices, X2 MSA family of devices, and/or X-Pak MSA family of devices. Alternatively, the module 100 may be compatible with a 300-pin MSA family of devices.

In embodiments of the present invention, the dual board flex circuit 110 may include circuitry to convert an electrical signal to an optical signal and to transmit the optical signal, to the port 108, for example. The circuitry may include a laser, a laser driver, signal conditioning circuitry, such as clock and data recovery (CDR) circuitry, for example, amplifiers, one or more microcontrollers a photodetector, and other circuitry. The dual board flex circuit 110 also may include circuitry to receive an optical signal from the port 109, for example, and to convert the optical signal to an electrical signal.

Figure 2:
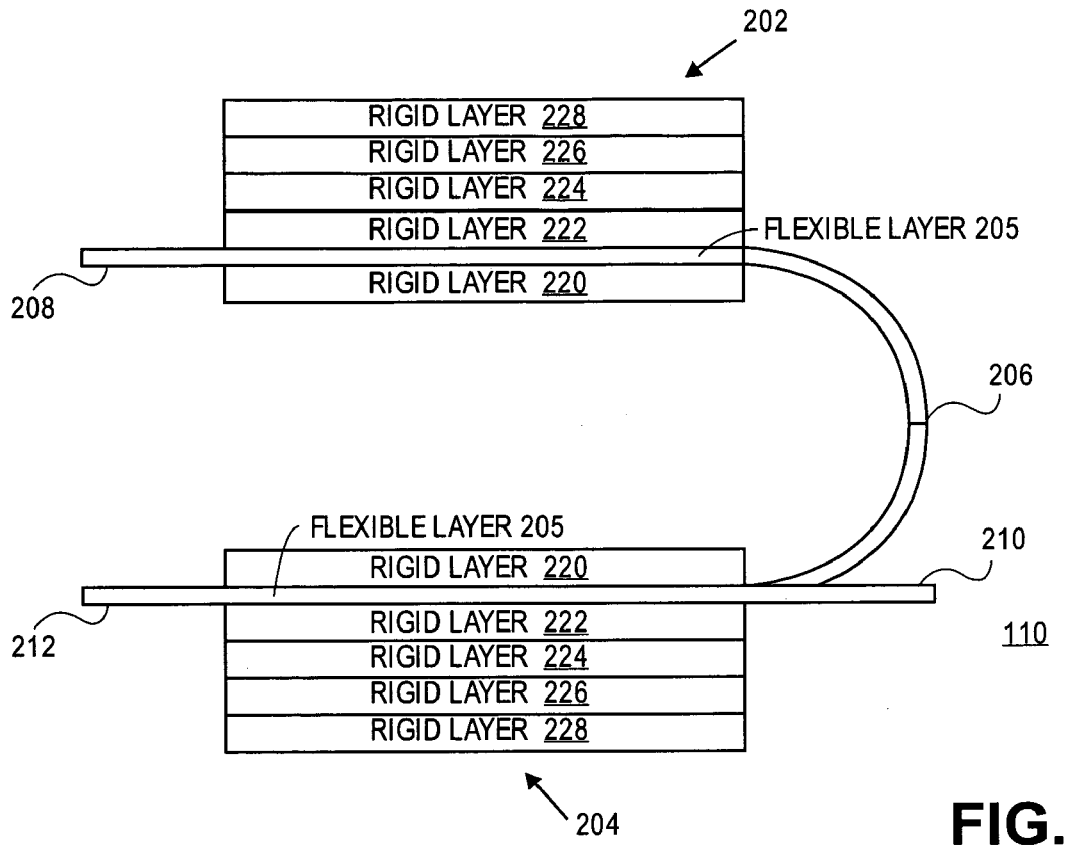
FIG. 2 shows a cross-section of the dual board flex circuit 110 according to an embodiment of the present invention.

FIG. 2 shows a cross-section of the dual board flex circuit 110 according to an embodiment of the present invention. In embodiments of the present invention, the dual board flex circuit 110 may be a rigid-flex printed circuit board (PCB), a flex-rigid printed circuit board (PCB), or any suitable rigid and flexible printed circuit board (PCB) assembly having a first multiple layer rigid printed circuit board (PCB) 202 and a second multiple layer rigid printed circuit board (PCB) 204 sharing a common flexible printed circuit layer 205. The flexible printed circuit layer 205 according to the embodiment illustrated in FIG. 2 extends beyond the two multiple layer rigid printed circuit boards 202 and 204 to form a flexible connector 206 and to form several flexible printed circuit tabs 208, 210, and 212. The multiple layer rigid printed circuit board 202 includes several rigid layers 220, 222, 224, 226, and 228. The second multiple layer rigid printed circuit board 204 includes several rigid layers 230, 232, 234, 236, and 238.

In embodiments of the present invention, the multiple layer rigid printed circuit board 202 may include circuitry associated with the transmitter portion of the optical transponder module 100. For example, the multiple layer rigid printed circuit board 202 may include circuitry for controlling temperature, set points, etc., for the transmitter portion of the optical transponder module 100.

In embodiments of the present invention, the multiple layer rigid printed circuit board 204 may include circuitry associated with the transmitter and receiver portions of the optical transponder module 100. For example, the multiple layer rigid printed circuit board 204 may include a laser, a laser driver, signal conditioning circuitry, power conditioning circuitry, such as filters and regulators, for example, photodetectors, amplifiers, etc. The multiple layer rigid printed circuit board 204 also may include the data path for the transmitter and receiver portions of the optical transponder module 100.

In embodiments of the present invention, the common flexible printed circuit layer 205, the flexible connector 206, and the flexible printed circuit tabs 208, 210, and 212 may have printed circuitry capable of carrying power, ground, control signals, and/or data signals, such as 10 Gb/s data signals, for example.

In embodiments, the flexible connector 206 may be any suitable flexible connector that connects the two multiple layer rigid printed circuit boards 202 and 204 to each other. In one embodiment, the flexible connector 206 may be a flexible printed circuit. In an alternative embodiment, the flexible connector 206 may be a ribbon cable.

In embodiments, the flexible connector 206 may couple all or some portion of slow and/or low frequency signals, such as (DC) power, ground, and or control signals, for example, as well as fast and/or high frequency signals, such as data signals, for example, between the two multiple layer rigid printed circuit boards 202 and 204. Slow and/or low frequency signals may be around several hundred KHz, for example. Fast and/or high frequency signals may be around 10 Gb/s.

In some embodiments, the flexible printed circuit tab 208 may carry all or some portion of slow and/or low frequency signals, such as (DC) power, ground, and or control signals, for example, as well as fast and/or high frequency signals, such as data signals, for example. The signals may be provided to the transmitter portion of the optical transponder module 100 and/or the receiver portion of the optical transponder module 100.

In some embodiments, the flexible printed circuit tab 210 may carry all or some portion of slow and/or low frequency signals, such as (DC) power, ground, and or control signals, for example, as well as fast and/or high frequency signals, such as data, for example. The signals may be provided to the transmitter portion of the optical transponder module 100 and/or the receiver portion of the optical transponder module 100.

In some embodiments, the flexible printed circuit tab 212 may carry all or some portion of slow and/or low frequency signals, such as (DC) power, ground, and or control signals, for example, as well as fast and/or high frequency signals, such as, for example in The signals may be provided to the transmitter portion of the optical transponder module 100 and/or the receiver portion of the optical transponder module 100.

Figure 3:
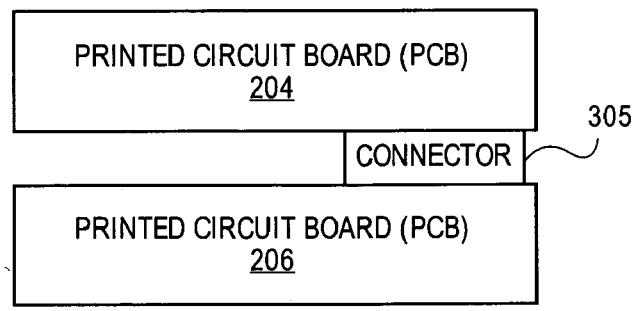
FIG. 3 shows a perspective view of a dual board flex circuit according to an alternative embodiment of the present invention.

FIG. 3 shows a cross-section of the dual board flex circuit 110 according to an alternative embodiment of the present invention in which the first multiple layer rigid printed circuit board (PCB) 202 and the second multiple layer rigid printed circuit board (PCB) 204 are coupled together using connector 305.

In embodiments of the present invention, the connector 305 may be any suitable connector, such as a plug-socket and/or male-female connector assembly, hybrid flex, ribbon cable capable of coupling all or some portion of slow and/or low frequency signals, such as (DC) power, ground, and or control signals, for example, as well as fast and/or high frequency signals, such as data, for example, between the first and second multiple layer rigid printed circuit boards 202 and 204, such as to the transmitter and/or receiver portions of the optical transponder module 100.

Figure 4:
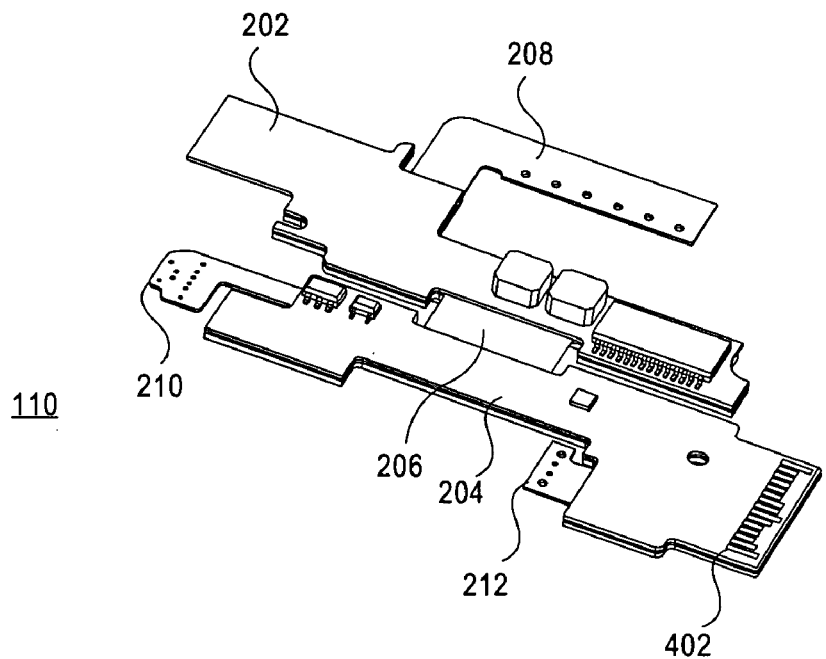
FIG. 4 is a perspective view showing an unfolded dual board flex circuit according to an embodiment of the present invention.

FIG. 4 is a perspective view showing the dual board flex circuit 110 unfolded according to an embodiment of the present invention. The illustrated embodiment shows the dual board flex circuit 110 with the two multiple layer rigid printed circuit boards 202 and 204 coupled together with the flexible connector 206. The illustrated embodiment also shows the flexible printed circuit tab 208 coupled to the flexible printed circuit board 202, and the flexible printed circuit tabs 210 and 212 coupled to the flexible printed circuit board 204. In the illustrated embodiment, the multiple layer rigid printed circuit board 202 includes an edge connector 402.

The connector 402 includes fingers that may couple power, ground, control signals, and/or data signals to the multiple layer rigid printed circuit board 202. In one embodiment, power, and/or ground are coupled from the connector 402 to the multiple layer rigid printed circuit board 202, through the flexible connector 206, and to the multiple layer rigid printed circuit board 204, while control signals and/or data signals remain on the multiple layer rigid printed circuit board 202. In embodiments of the present invention, the connector 402 may be compatible with the 300-pin, XFP, XENPAK, or other suitable MSA. For example, in embodiments in which the connector 402 may be compatible with an XFP MSA, the connector 402 may be a 30-pin connector. In embodiments in which the connector 402 may be compatible with a XENPAK MSA, the connector 402 may be a 70-pin connector.

Figure 5:
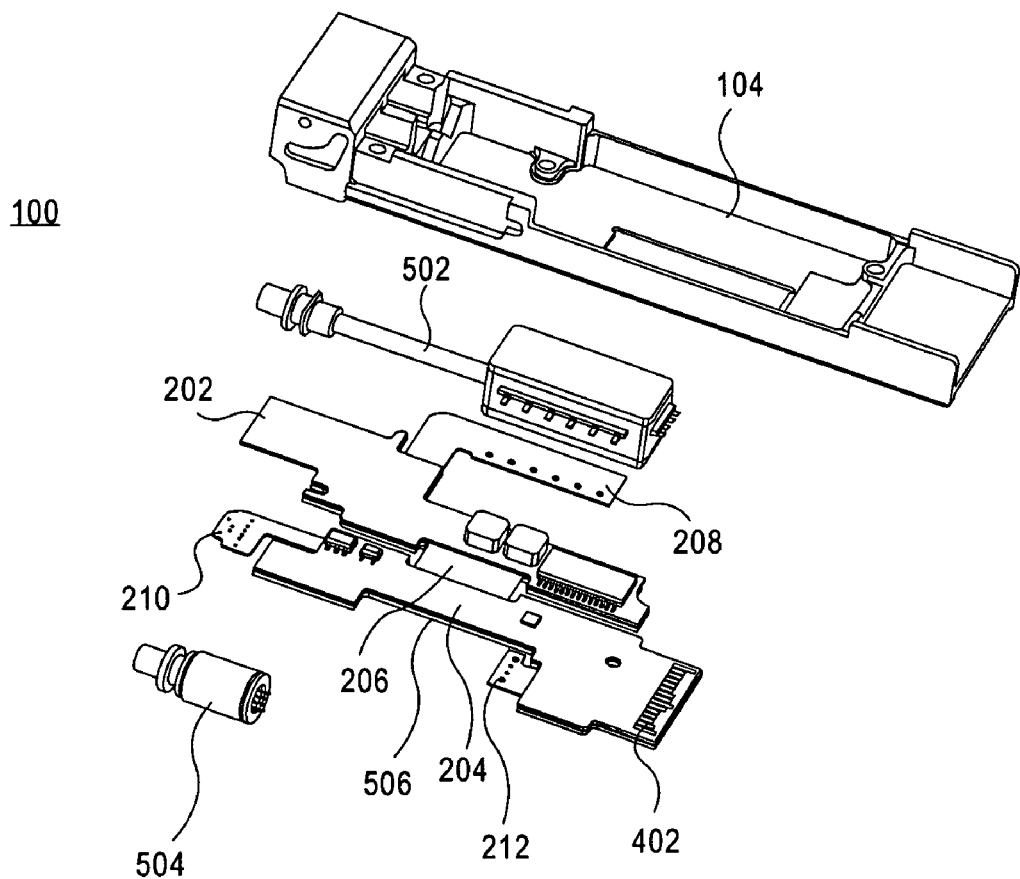
FIG. 5 is a perspective view showing an unfolded dual board flex circuit and its relationship to an optical transponder module body according to an embodiment of the present invention.

FIG. 5 is a perspective view showing the dual board flex circuit 110 unfolded and its relationship to the module body 104 according to an embodiment of the present invention. In the illustrated embodiment, a transmitter 502 is to be coupled to the flexible printed circuit tab 210. In the illustrated embodiment, a receiver 504 is to be coupled to the flexible printed circuit tabs 208 and 212. The multiple layer rigid printed circuit board 204 includes a cutout 506 to accommodate the transmitter 502. Note that in the illustrated embodiment the footprint of the unfolded dual board flex circuit 110 is larger than the footprint of the module body 104 and that unfolded the dual board flex circuit 110 does not fit into the module body 104.

Figure 6:
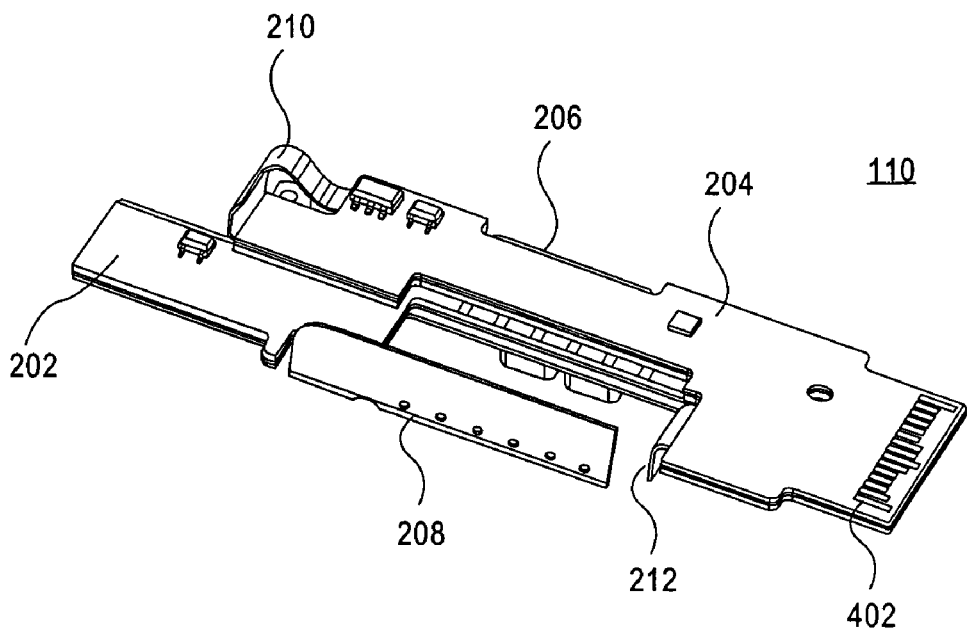
FIG. 6 is a perspective view showing a folded dual board flex circuit according to an embodiment of the present invention.

FIG. 6 is a perspective view showing the dual board flex circuit 110 according to an embodiment of the present invention in which the multiple layer rigid printed circuit board 202 is folded under the multiple layer rigid printed circuit board 204 using the flexible connector 206 so that the flexible printed circuit tab 208 on the multiple layer rigid printed circuit board 202 fits in the cutout 506 of the multiple layer rigid printed circuit board 204. In the illustrated embodiment, the multiple layer rigid printed circuit board 204 is folded on top of the multiple layer rigid printed circuit board 202. In other embodiments, the multiple layer rigid printed circuit board 202 may be folded on top of the multiple layer rigid printed circuit board 204.

Figure 7:
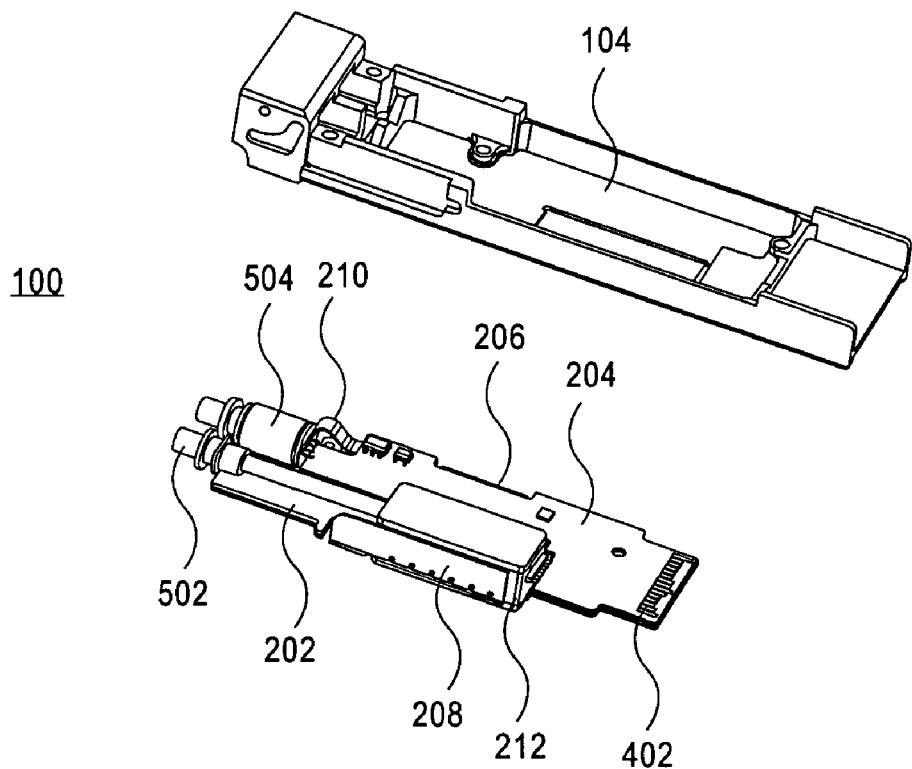
FIG. 7 is a perspective view showing a folded dual board flex circuit and its relationship to an optical transponder module body according to an embodiment of the present invention.

FIG. 7 is a perspective view showing the dual board flex circuit 110 and its relationship to the module body 104 according to an embodiment of the present invention. In the illustrated embodiment, the receiver 504 is coupled to the multiple layer rigid printed circuit board 204 via the flexible printed circuit tab 210 and the transmitter 502 is coupled to the multiple layer rigid printed circuit board 202 via the flexible printed circuit tabs 208 and the multiple layer rigid printed circuit board 204 via the flexible printed circuit tabs 210 and 212. In the illustrated embodiment, the multiple layer rigid printed circuit board 202 is folded under the multiple layer rigid printed circuit board 204 using the flexible connector 206. Note that in the illustrated embodiment the footprint of the folded dual board flex circuit 110 is not larger than the footprint of the module body 104.

Figure 8:
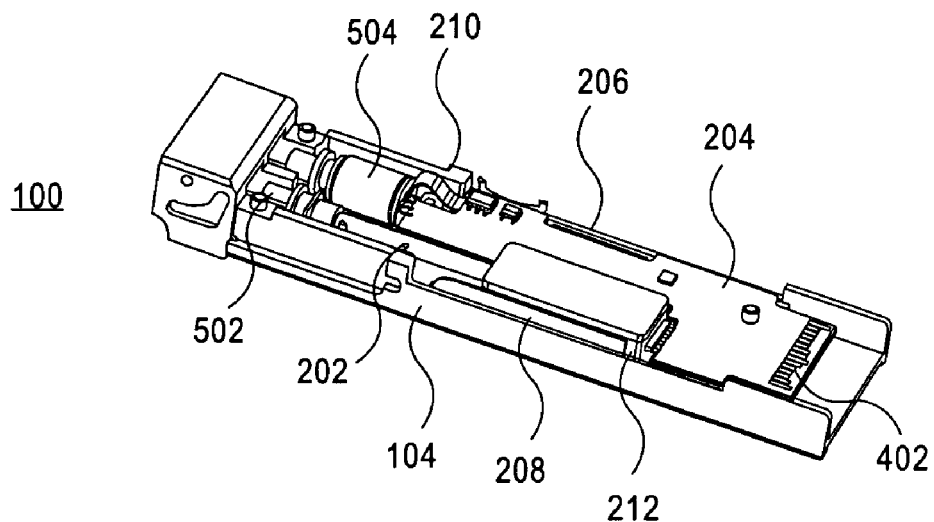
FIG. 8 is a perspective view showing a folded dual board flex circuit inside an optical transponder module body according to an embodiment of the present invention.

FIG. 8 is a perspective view showing the dual board flex circuit 110 inside the module body 104 according to an embodiment of the present invention Note that in the illustrated embodiment the folded dual board flex circuit 110 fits in the module body 104.

Figure 9:
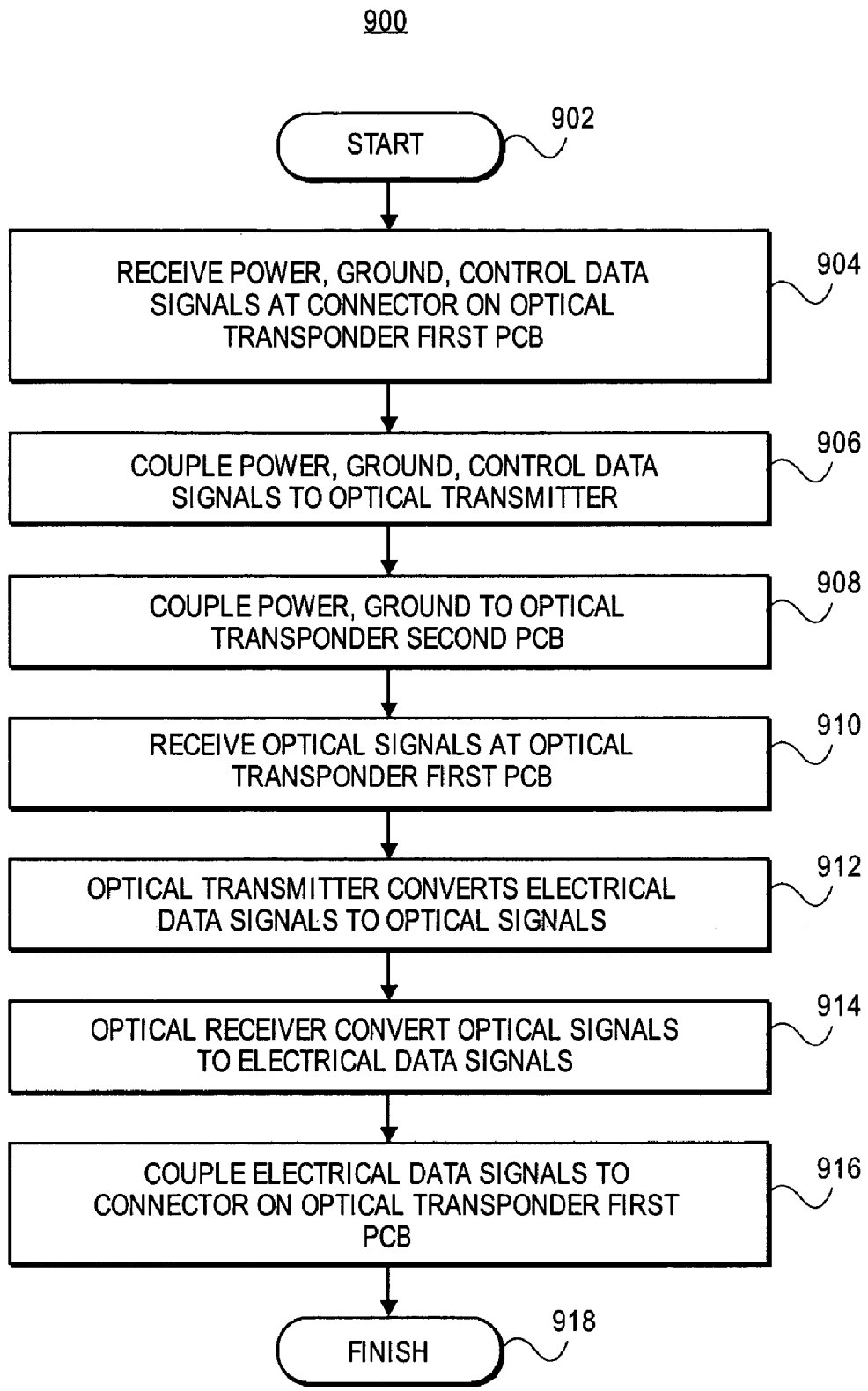
FIG. 9 is a flowchart illustrating a method for operating the optical transponder module 100 according to an embodiment of the present invention.
Figure 10:
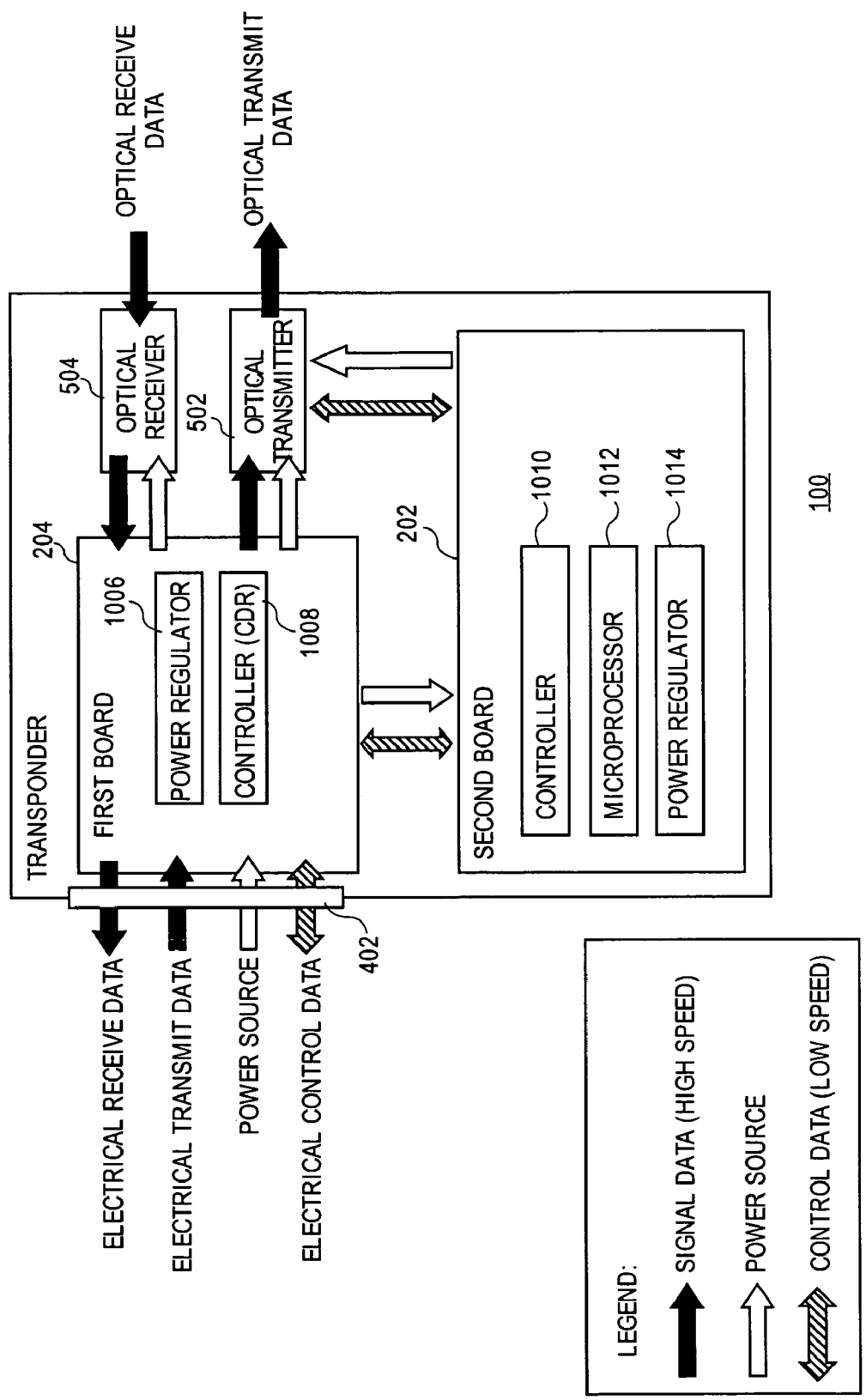
FIG. 10 is a high-level block diagram illustrating an optical transponder module according to an alternative embodiment of the present invention.

FIG. 9 is a flowchart illustrating a method 900 for operating the optical transponder module 100 according to an embodiment of the present invention. The method 900 is described with reference to FIG. 10, which is high-level block diagram of the optical transponder module 100 according to an embodiment of the present invention. The illustrated optical transponder module 1000 includes the optical receiver 504 and the optical transmitter 502 coupled to the multiple layer rigid printed circuit board 202. The illustrated optical transmitter 502 also is coupled to the multiple layer rigid printed circuit board 204. The illustrated multiple layer rigid printed circuit board 202 is coupled to the multiple layer rigid printed circuit board 204.

The example multiple layer rigid printed circuit board 202 includes a power regulator 1006 and a CDR controller 1008. The example multiple layer rigid printed circuit board 204 includes a controller 1010, a microprocessor 1012, and a power regulator 1014.

The method 900 begins with a block 902, where control passes to a block 904. In the block 904, the multiple layer rigid printed circuit board 204 may receive power and/or ground, electrical control data, and/or electrical transmit data via the connector 402.

In a block 906, power and/or ground, and/or electrical control data may be coupled to optical transmitter 1004 from the multiple layer rigid printed circuit board 202.

In a block 908, power and/or ground signals may be coupled to the multiple layer rigid printed circuit board 202 from the multiple layer rigid printed circuit board 204 via the flexible connector 206, for example, or the connector 305, for example.

In a block 910, the optical receiver 504 may receive optical data.

In a block 912, the optical transmitter 502 may convert electrical transmit data to optical transmit data. In one embodiment, the optical transmitter 502 may transmit the optical transmit data.

In a block 914, the optical receiver 1002 may convert the optical receive data to electrical receive data.

In a block 916, electrical receive data may be coupled from the optical receiver 1002 to the connector 402.

In a block 918, the method 900 finishes.

The operations of the method 900 have been described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented. Of course, the method 900 is an example process and other processes may be used to implement embodiments of the present invention. A machine-accessible medium with machine-readable data thereon may be used to cause a machine, such as, for example, a processor (not shown) to perform the method 900.

Embodiments of the present invention may be implemented using hardware, software, or a combination thereof. In implementations using software, the software may be stored on a machine-accessible medium.

A machine-accessible medium includes any mechanism that may be adapted to store and/or transmit information in a form accessible by a machine (e.g., a computer, network device, personal digital assistant, manufacturing tool, any device with a set of one or more processors, etc.). For example, a machine-accessible medium includes recordable and non-recordable media (e.g., read only memory (ROM), random access memory (RAM), magnetic disk storage media, optical storage media, flash memory devices, etc.), such as electrical, optical, acoustic, or other form of propagated signals (e.g., carrier waves, infrared signals, digital signals, etc.).

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:
an optical transponder module;
a first printed circuit board disposed in the optical transponder module, wherein the first printed circuit board includes multiple layers, wherein at least one layer in the first circuit board is a rigid layer, the first printed circuit board having further at least one flexible printed circuit tab; and
a second printed circuit board disposed in the optical transponder module under the first printed circuit board, wherein the second printed circuit board includes multiple layers, wherein at least one layer in the first circuit board is a rigid layer, the second printed circuit board having at least one cutout to receive the flexible printed circuit tab of the first printed circuit board as the second printed circuit board is disposed under the first printed circuit board,
wherein at least one layer in the first printed circuit board and/or the second printed circuit board is a flexible printed circuit layer.

2. The apparatus of claim 1, wherein the flexible printed circuit layer couples the first printed circuit board to the second printed circuit board.

3. The apparatus of claim 2, wherein the flexible printed circuit includes at least one control signal path for the optical transponder module, at least one data path for the optical transponder module, and/or at least one power and/or ground signal path for the optical transponder module.

4. The apparatus of claim 1, wherein the optical transponder module comprises at least one form factor chosen from an XFP Multi-Source Agreement (MSA) form factor, XPAK MSA form factor, X2 MSA form factor, small form factor, and/or small form factor pluggable.

5. An apparatus, comprising:
a first printed circuit board disposed in an optical transponder module, the first printed circuit board having further at least one flexible printed circuit tab;

a second printed circuit board disposed in the optical transponder module under the first printed circuit board, the second printed circuit board having at least one cutout to receive the flexible printed circuit tab of the first printed circuit board as the second printed circuit board is disposed under the first printed circuit board;

a first connector terminal disposed on the first printed circuit board; and a second connector terminal disposed on the second printed circuit board, wherein the first connector terminal is to mate with the second connector terminal to couple the first printed circuit board to the second printed circuit board.

6. The apparatus of claim 5, wherein the first and/or the second printed circuit board includes at least one layer of flexible printed circuit.

7. The apparatus of claim 6, wherein the layer of flexible printed circuit includes at least one of a power and/or ground planes, a data path for the optical transponder module, and/or a control signal path for the optical transponder module.

8. The apparatus of claim 5, wherein the optical transponder module at least one form factor chosen from an XFP Multi-Source Agreement (MSA) form factor, XPAK MSA form factor, X2 MSA form factor, small form factor, and/or small form factor pluggable.

9. A system, comprising:
a first printed circuit board disposed in an optical transponder module, the first printed circuit board having at least one flexible printed circuit tab;

a second printed circuit board disposed in the optical transponder module under the first printed circuit board, the second printed circuit board having at least one cutout to receive the flexible printed circuit tab of the first printed circuit board as the second printed circuit board is disposed under the first printed circuit board;

means for connecting the first printed circuit board to the second printed circuit board; and a connector coupled to the optical transponder module, the connector being compatible with at least one connector chosen from an XFP Multi-Source Agreement (MSA) connector, XPAK MSA connector, X2 MSA connector, small form factor connector, and/or small form factor pluggable connector.

10. The system of claim 9, wherein the means for connecting the first printed circuit board to the second printed circuit board comprises a socket-plug assembly.

11. The system of claim 9, wherein the means for connecting the first printed circuit board to the second printed circuit board comprises a flexible printed circuit layer disposed in the first printed circuit board and the second printed circuit board.

12. A method, comprising:
receiving power, ground, control and/or electrical data signals at a connector disposed on a first printed circuit board in an optical transponder module, the first printed circuit board having at least one flexible printed circuit tab;

coupling the control and/or electrical data signals to a laser disposed on the first printed circuit board;

coupling the power and/or ground signals to a second printed circuit board disposed in the optical transponder module under the first printed circuit board, the second printed circuit board having at least one cutout to receive the flexible printed circuit tab of the first printed circuit board as the second printed circuit board is disposed under the first printed circuit board; and converting the electrical data signals to optical data signals using the laser.

13. The method of claim 12, further comprising:
receiving optical signals at an optical signal receiver disposed on the second printed circuit board; and converting optical signals to electrical data signals using the optical signal receiver.

14. The method of claim 13, further comprising coupling electrical data signals from the optical signal receiver to the connector.

15. The method of claim 12, further comprising transmitting the optical data signals.

* * * * *